United States Patent
Deckman et al.

(10) Patent No.: US 7,400,215 B2
(45) Date of Patent: Jul. 15, 2008

(54) METHOD AND APPARATUS FOR INCREASING PERFORMANCE IN A WAVEGUIDE-BASED SPATIAL POWER COMBINER

(75) Inventors: Blythe Chadwick Deckman, Corona, CA (US); James Jordan Rosenberg, Monrovia, CA (US); Chun-Tung Cheung, Pasadena, CA (US); Michael Peter DeLisio, Jr., Monrovia, CA (US)

(73) Assignee: Wavestream Corporation, San Dimas, CA (US)

( * ) Notice: Subject to any disclaimer, the term of this patent is extended or adjusted under 35 U.S.C. 154(b) by 109 days.

(21) Appl. No.: 11/371,247

(22) Filed: Mar. 8, 2006

(65) Prior Publication Data
US 2006/0202777 A1   Sep. 14, 2006

Related U.S. Application Data

(60) Provisional application No. 60/660,029, filed on Mar. 8, 2005.

(51) Int. Cl.
*H01P 5/12* (2006.01)
*H01P 3/08* (2006.01)
(52) U.S. Cl. .................. 333/125; 333/128; 333/136; 333/137
(58) Field of Classification Search ............. 333/125, 333/127, 128, 136, 137; 330/286, 295
See application file for complete search history.

(56) References Cited

U.S. PATENT DOCUMENTS

| | | | | |
|---|---|---|---|---|
| 4,291,278 A | * | 9/1981 | Quine | 330/286 |
| 5,736,908 A | * | 4/1998 | Alexanian et al. | 333/125 |
| 5,920,240 A | * | 7/1999 | Alexanian et al. | 333/127 |
| 6,028,483 A | * | 2/2000 | Shealy et al. | 330/286 |
| 6,686,875 B1 | * | 2/2004 | Wolfson et al. | 342/175 |
| 7,215,220 B1 | * | 5/2007 | Jia | 333/125 |

* cited by examiner

*Primary Examiner*—Robert J. Pascal
*Assistant Examiner*—Kimberly E Glenn
(74) *Attorney, Agent, or Firm*—Sidley Austin LLP

(57) ABSTRACT

A power combining array and method of increasing performance in a power combining array includes a waveguide enclosure having a plurality of slotline modules disposed therein. The slotline modules include input and output antennas that have varying physical characteristics to overcome differences in field intensity across the slotline module configuration and to account for phase changes. The varying physical characteristics include differences in longitudinal position, thickness, dielectric constant, and circuit element configurations. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or the meaning of the claims.

89 Claims, 6 Drawing Sheets

METHOD AND APPARATUS FOR INCREASING PERFORMANCE IN A WAVEGUIDE-BASED SPATIAL POWER COMBINER

CROSS-REFERENCE TO RELATED APPLICATIONS

This application claims priority to the provisional patent application having Ser. No. 60/660,029 filed on Mar. 8, 2005, which is hereby incorporated by reference in its entirety as if fully set forth herein.

FIELD OF THE INVENTION

The present invention generally relates to amplification, generation, and control of microwave signals. Specifically, the present invention relates to increasing performance of spatially-combined arrays for microwave signals used in telecommunications and radar/imaging systems.

BACKGROUND OF THE INVENTION

Transmission line-to-waveguide transitions are used extensively in microwave communications systems such as radar and satellite systems. The systems may include a waveguide antenna for phased array applications or a conventional waveguide of arbitrary cross-section. In these systems the microwave signal may be bi-directionally coupled between a waveguide and a transmission line with minimal power (insertion) loss and maximum signal clarity.

One example of a known waveguide-based spatially combined amplifier is shown in FIG. 1(a). Microwave power is incident from the waveguide structure on the left. This energy illuminates a two-dimensional array of several slotline modules, with each slotline module forming a column of the array. Each slotline module consists of a dielectric card, upon which at least two circuit elements are mounted. The input energy is coupled to these circuit elements through an antenna which tapers to a slotline transmission line. Structures transform the microwave energy from the slotline mode to a microstrip mode, with the microstrip conductor printed on the side of the card opposite to the slotline. Energy on the microstrip is coupled to the input of the circuit elements. The outputs of the circuit elements are coupled to the waveguide in a similar manner.

Another known waveguide-based spatially combined amplifier is shown in FIG. 1(b). In FIG. 1(b), microwave power is incident from the coaxial waveguide structure on the left. This energy illuminates a two-dimensional annular array of several slotline modules, with each slotline module forming a radial column of the array. Each slotline module consists of a dielectric card, upon which at least two circuit elements are mounted. The input energy is coupled to these circuit elements through an antenna which tapers to a slotline transmission line. Structures transform the microwave energy from the slotline mode to a microstrip mode, with the microstrip conductor printed on the side of the card opposite to the slotline. Energy on the microstrip is coupled to the input of the circuit elements. The outputs of the circuit elements are coupled to the output coaxial waveguide in a similar manner.

The use of the word slotline is intended to include any and all of the family of balanced microwave transmission line structures where the signal power is concentrated in a gap between two substantially symmetric conductors printed on one or both sides of a dielectric substrate. Common terms for these transmission line structures include slotline, finline, antipodal finline, unilateral finline, bilateral finline, and insulated finline. The use of the term "slotline" in this application is therefore intended to be consistent with standard terminology widely known in the art.

In existing rectangular waveguide spatial power combiner configurations such as that of FIG. 1(a), the field intensity in the rectangular waveguide follows a sinusoidal distribution, with the result that the slotline modules in the center of the structure receive more power than the slotline modules along the edge. Similarly, the outputs of the central modules couple to the waveguide more effectively than the edge modules. This imbalance in the signal amplitude reduces the power-combining efficiency of the entire array.

SUMMARY OF THE INVENTION

In one embodiment, the present invention provides a power combiner apparatus comprising a waveguide enclosure defined on an input side by an input waveguide section supporting an input field, and on an output side by an output waveguide section supporting an output field. The power combining apparatus includes an array of slotline modules disposed within the waveguide enclosure between the input waveguide section and the output waveguide section along an H-direction defined as a direction perpendicular to both a direction of propagation and a direction of an electric field in a fundamental mode supported by the waveguide enclosure, each slotline module in the array of slotline modules including a circuit element having an input portion and an output portion, an input slotline antenna disposed between the input waveguide section and the input portion of the circuit element, and an output slotline antenna disposed between the output waveguide section and the output portion of the circuit element. Different slotline modules within the array of slotline modules are configured to have varying characteristics according to a position of each slotline module in the array of slotline modules within the waveguide enclosure to cause a signal amplitude balance among the slotline modules to substantially follow a specified amplitude contour.

The present invention also includes a method of increasing performance in a power combining array comprising applying a microwave signal to a waveguide enclosure having a plurality of slotline modules positioned therein, each slotline module having at least one pair of slotline antennas, wherein a field intensity of the microwave signal applied to the waveguide enclosure is stronger at a center of the waveguide enclosure and weaker at edges of the waveguide enclosure, and varying characteristics of the slotline modules to cause an amplitude balance among the slotline modules to substantially match a specified amplitude contour through each slotline module.

In another embodiment, the present invention provides a power combiner apparatus comprising a waveguide enclosure defined on an input side by an input waveguide section supporting an input field, and on an output side by an output waveguide section supporting an output field. The power combining apparatus includes an array of slotline modules disposed within the waveguide enclosure between the input waveguide section and the output waveguide section along an H-direction defined as a direction perpendicular to both a direction of propagation, defined as the longitudinal direction, and a direction of an electric field in a fundamental mode supported by the waveguide enclosure, defined as the E-direction, each slotline module in the array of slotline modules including a circuit element having an input portion and an output portion, and a pair of slotline antennas including an input slotline antenna disposed between the input waveguide section and the input portion of the circuit element, and an output slotline antenna disposed between the output waveguide section and the output portion of the circuit element. At least one of the input antennas and output antennas includes an associated slotline-to-microstrip transition having a slotline transmission line on one face of a dielectric layer upon which the slotline antenna is disposed, and having a conducting strip oriented substantially perpendicular to the slotline antenna on an opposite face of the dielectric layer, the conducting strip forming a pair of differentially driven microstrip lines coupling the slotline antenna to an associated circuit element.

The foregoing and other aspects of the present invention will be apparent from the following detailed description of the embodiments, which makes reference to the several figures of the drawings as listed below.

DETAILED DESCRIPTION OF THE EMBODIMENTS

In the following description of the present invention reference is made to the accompanying drawings which form a part thereof, and in which is shown, by way of illustration, exemplary embodiments illustrating the principles of the present invention and how it may be practiced. It is to be understood that other embodiments may be utilized to practice the present invention and structural and functional changes may be made thereto without departing from the scope of the present invention.

The embodiments of the invention include systems and methods that can be implemented to increase the performance of spatially-combined arrays, a class of microwave devices. These devices compete with conventional solid state and vacuum tube microwave amplifiers and sources (oscillators). The present invention discloses several architectures that increase the performance of these spatially combined arrays by adjusting the amplitude balance of the signals among individual slotline modules according to a specified amplitude contour, accomplished by varying some property of the slotline modules. Further, the embodiments of the invention include slotline-to-microstrip transitions and delay equalization structures that further enhance the power combining efficiency. These architectures need not be used exclusively; one or more of the techniques could be used together to improve the performance of the spatially combined amplifier.

Figure 1A:
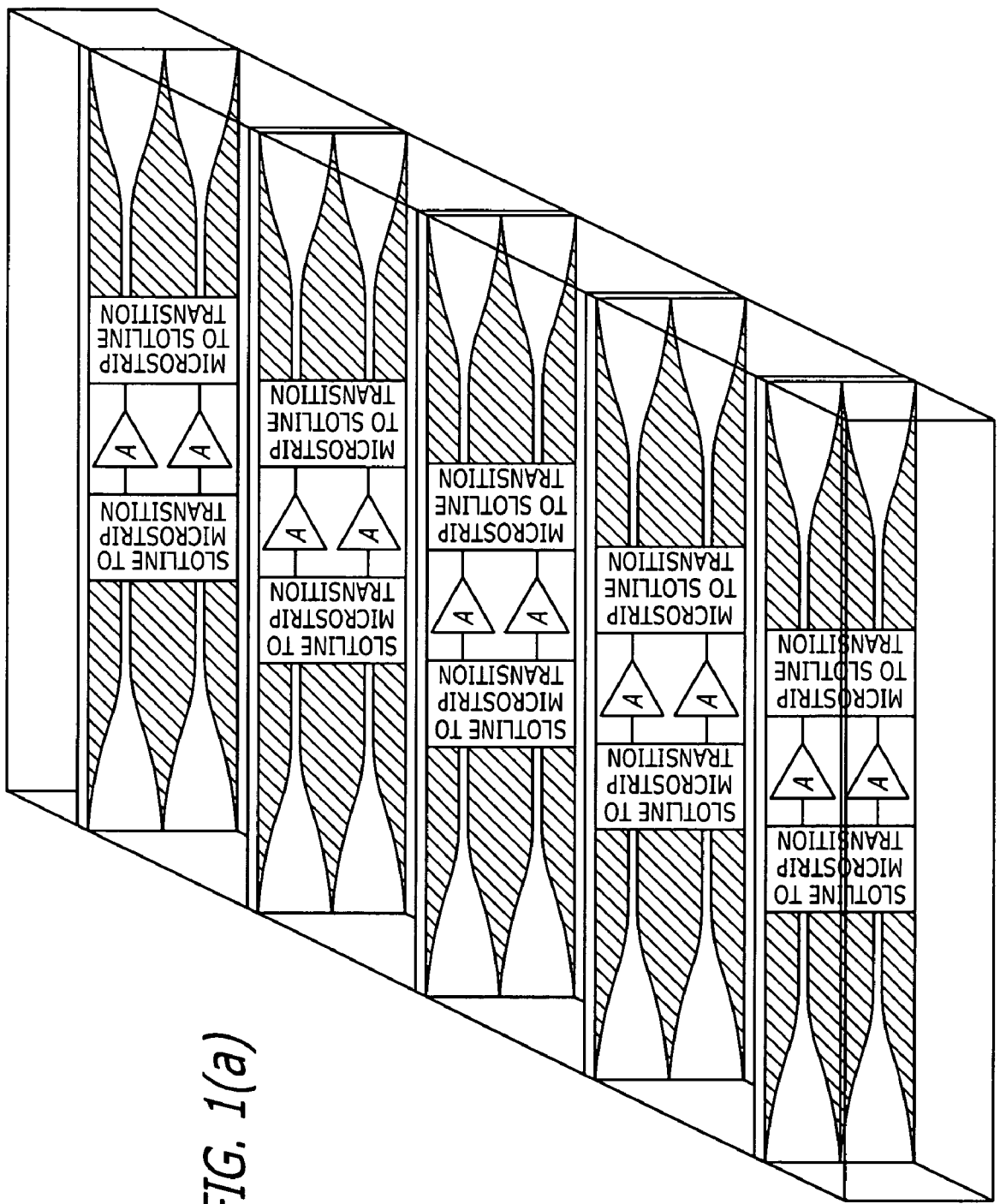
FIG. 1(a) is a perspective view of a prior art waveguide-based spatially combined amplifier.
Figure 1B:
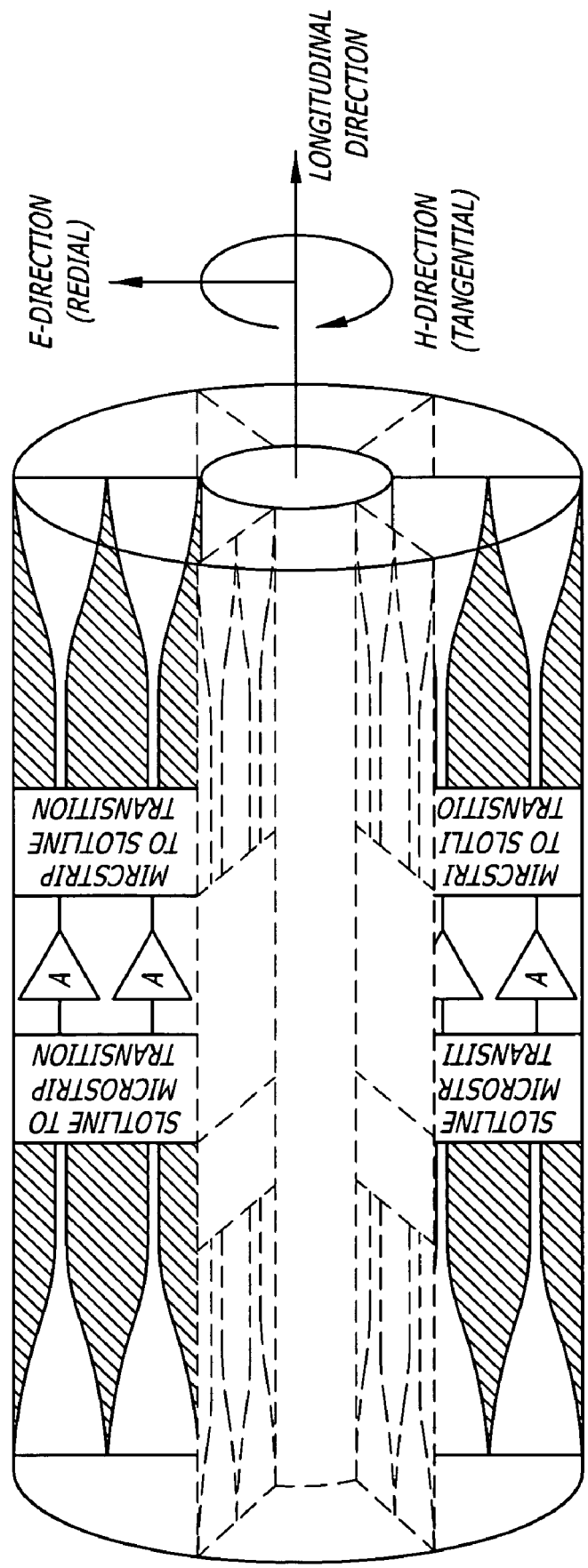
FIG. 1(b) is a perspective view of a prior art coaxial waveguide-based spatially combined amplifier.
Figure 2:
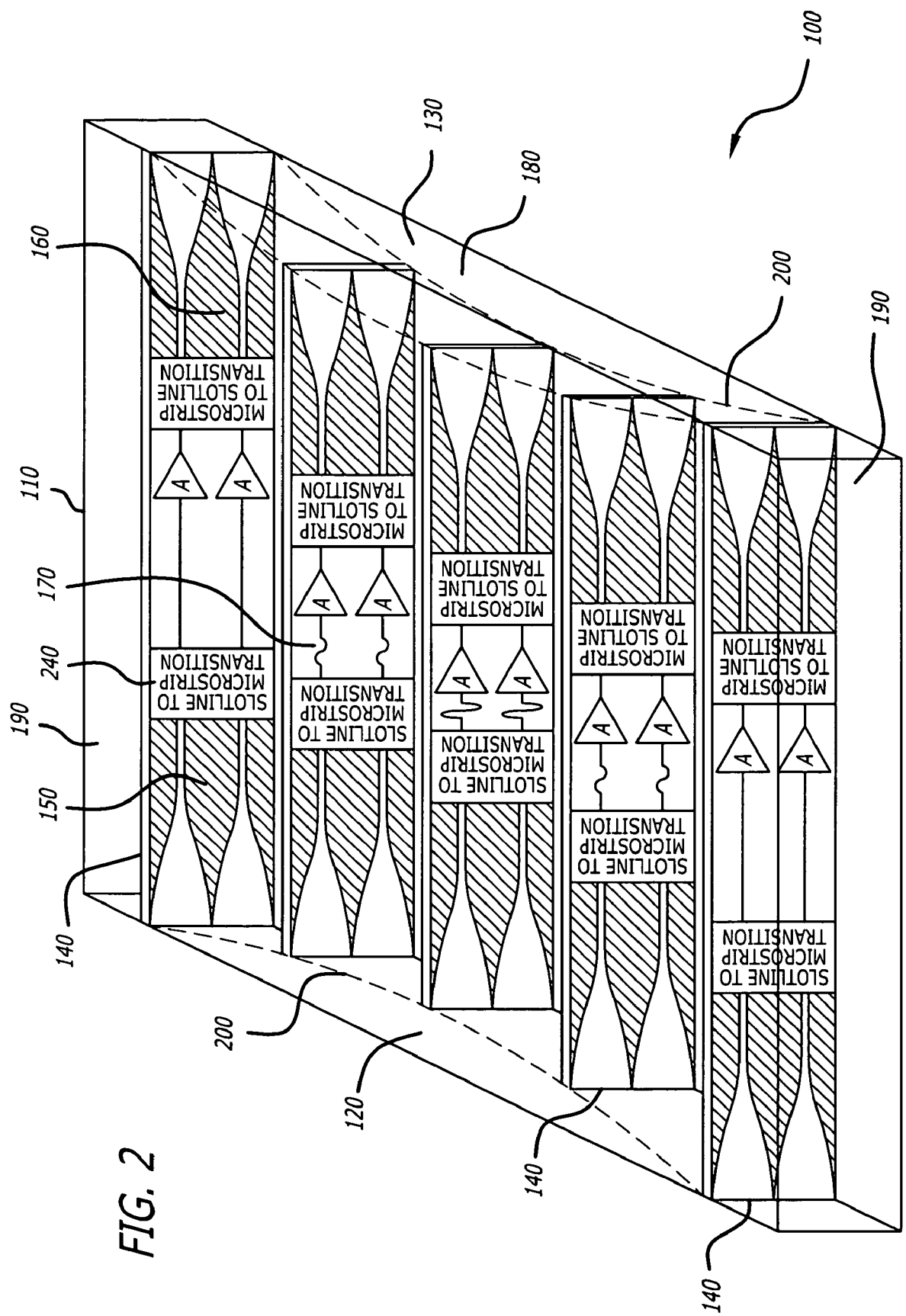
FIG. 2 is a perspective view of a waveguide-based spatially combined amplifier array according to one embodiment of the present invention.

FIG. 2 is a perspective view of power combining array according to one embodiment of the present invention. In FIG. 2, a power combining array 100 includes a waveguide enclosure 110 having an input first end 120 and an output second end 130. Transversely disposed along an H-direction, and substantially aligned with an E-direction and a longitudinal direction extending between the input end 120 and the output end 130, are a plurality of slotline modules 140. Each slotline module 140 in the plurality of slotline modules 140 includes a pair of slotline antennas comprising an input slotline antenna 150 and an output slotline antenna 160. Each input slotline antenna 150 is disposed between the input end 120 of the waveguide enclosure 110 and a circuit portion 170. Each output slotline antenna 160 is disposed between the output end 130 of the waveguide enclosure 110 and the circuit portion 170.

The present invention increases performance of the power combining array 100 by varying characteristics of the slotline modules 140 to cause the signal amplitude applied to each module to substantially follow a specified amplitude contour according to the modules position along the H-direction within the waveguide enclosure 110. When a signal is applied, signal intensity is strongest across a center 180 of the waveguide enclosure and gets weaker at edges 190 of the waveguide enclosure. Therefore, signal amplitudes across slotline modules 140 at the center of the waveguide enclosure 110 are different from those across slotline modules 140 at the edges of the waveguide enclosure 110, resulting in a lack of uniformity in amplitude balance.

In an amplifying array, full utilization of the power-handling capability of the circuit elements requires that each circuit element is driven at the same fraction of its maximum signal power capability. In the case of modules having substantially identical circuit elements, the specified amplitude contour for maximum power-handling capacity would be a substantially equal distribution of amplitudes among the modules. If the different modules have differing circuit elements, the specified amplitude contour may be tailored to provide each circuit a signal strength matched to its power-handling capacity. Further, a non-uniform amplitude contour may be specified for a set of modules having either identical or differing circuit elements in order to optimize a performance metric other than power-handling capacity, such as spectral regrowth performance.

In the present invention, one method of causing the signal amplitude to follow a specified amplitude contour is by varying a longitudinal position of at least one of the slotline antennas on at least one slotline module 140. Referring to FIG. 2, the longitudinal position of slotline antennas are varied according to a specified physical contour 200 at the input end 120 of the waveguide enclosure and at the output end 130 of the waveguide enclosure in order to achieve the specified amplitude contour. In one embodiment, the longitudinal position of the slotline antennas in different slotline modules are varied according each module's position along the H-direction within the waveguide enclosure 110 to achieve a specified amplitude contour. Increasing the distance between the waveguide ends 120 and 130 and the antennas of the slotline modules positioned nearer to the center of the waveguide enclosure 110 along the H-direction relative to the antennas of the modules positioned further from the center increases the relative amount of power in the modules further from the center. In another embodiment, varying the characteristics of the slotline modules includes varying the shape of the input and output slotline antennas to adjust the amplitude balance among individual slotline modules.

In another embodiment, a delay equalization portion 210 may be implemented with the circuit portion 170 of the slotline module to reduce delay imbalance among the slotline modules. Delay equalization may be characterized in the time domain as a time delay, or the frequency domain as a phase delay. Time delay equalization can be accomplished, for example, by inserting extra length into a transmission line path or by altering the propagation constant along a transmission path by varying dielectric loading. Time delay equalization generally has the advantage of operating over a broad range of frequencies. Phase delay equalization can be accomplished by altering reactive elements in the circuit or the transmission path. Phase delay equalization often has the advantage of small size and ease of adjustment. The delay equalization portion may be configured for phase delay equalization for narrowband applications, and may be configured for time delay equalization for broadband applications. It is noted that the delay equalization portion 210 may be implemented in conjunction with any technique for adjusting amplitude balance among the slotline modules.

Figure 3:
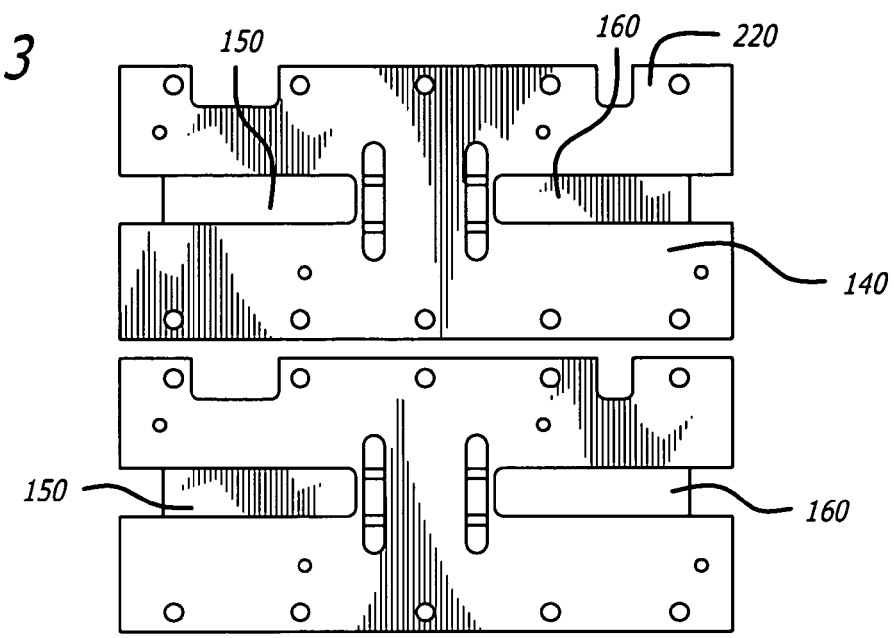
FIG. 3 are side views of different slotline modules for a waveguide enclosure according to one embodiment of the present invention.
Figure 4:
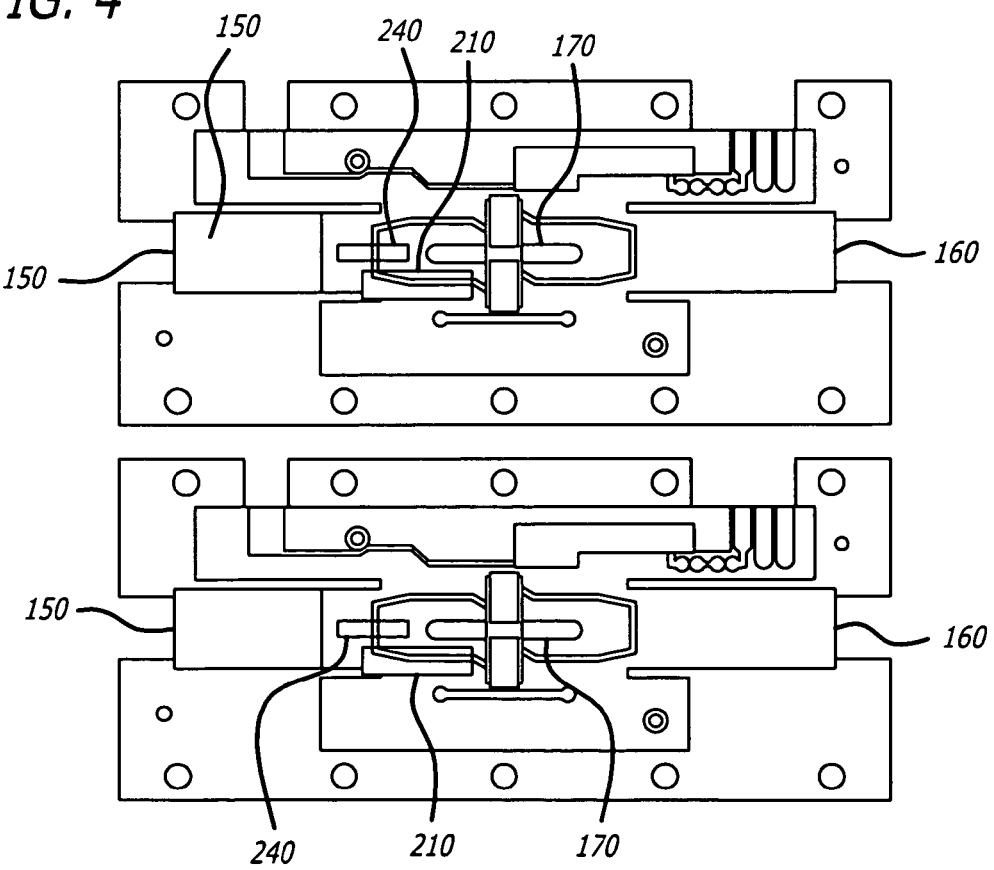
FIG. 4 are side views of different slotline modules for a waveguide enclosure according to another embodiment of the present invention.

FIG. 3 and FIG. 4 are close-up views of slotline modules disposed on a dielectric substrate 220 have one or more dielectric layers. FIG. 3 shows a variation in slotline antenna 160 tapering for a slotline module 140 positioned at or near the center 180 of the waveguide enclosure 110 as compared to tapering for a slotline antenna 160 for a slotline module 140 positioned near an edge 190 of the waveguide enclosure 100.

Figure 5:
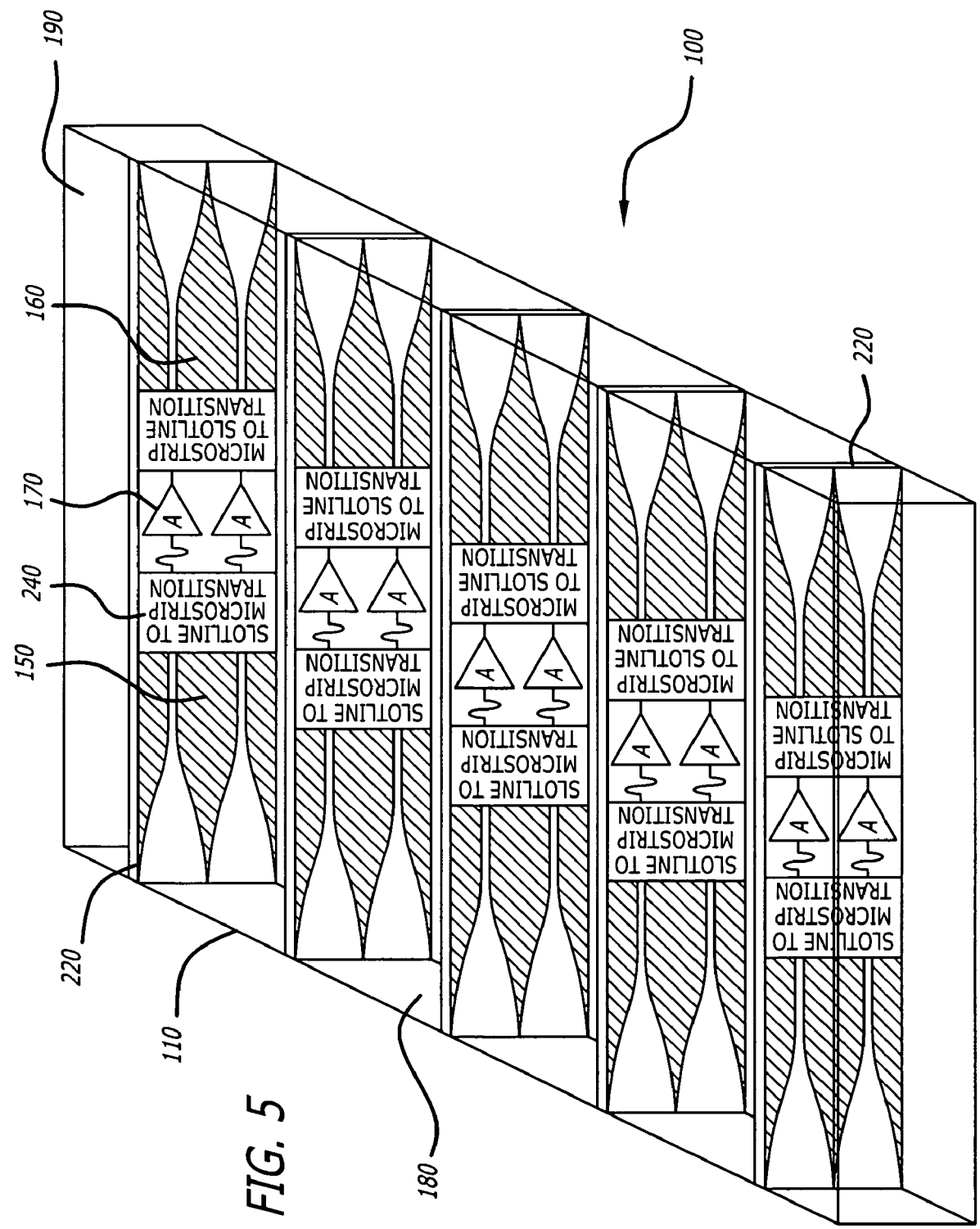
FIG. 5 is a perspective view of a waveguide-based spatially combined amplifier array according to another embodiment of the present invention.

FIG. 5 is a perspective view of a power combining array 100 according to another apparatus and method for performing the present invention. Performance of the power combining array 100 is increased by varying the physical thickness of the dielectric substrate 220 that the input slotline antennas 150, the output slotline antennas 160, the microstrip-to-slotline transition, and the circuit element 170 are printed on. Slotline modules 140 disposed upon thicker dielectric substrates 220 couple to the input and output fields more strongly than slotline modules 140 with thinner dielectric substrates 220. Accordingly, slotline modules 140 with thicker dielectric substrates 220 are positioned near edges 190 of the waveguide enclosure 110, while slotline modules 140 with thinner dielectric substrates 220 are positioned near the center 180 of the waveguide enclosure 110, thereby adjusting the coupling of the various slotline modules 140 to the input and output fields to match a specified amplitude contour. A dielectric constant 230 of the material comprising the dielectric substrate 220 may also be varied to affect the signal amplitude. By varying the thickness of the dielectric substrate 220 and/or the dielectric constant 230 in one or more slotline modules, the balance of signal amplitude applied across the plurality of slotline modules can be adjusted to increase performance in the power combining array 100. A delay equalization section 210 may also implemented with this embodiment to further balance the amplitude of the signal delay.

Figure 6:
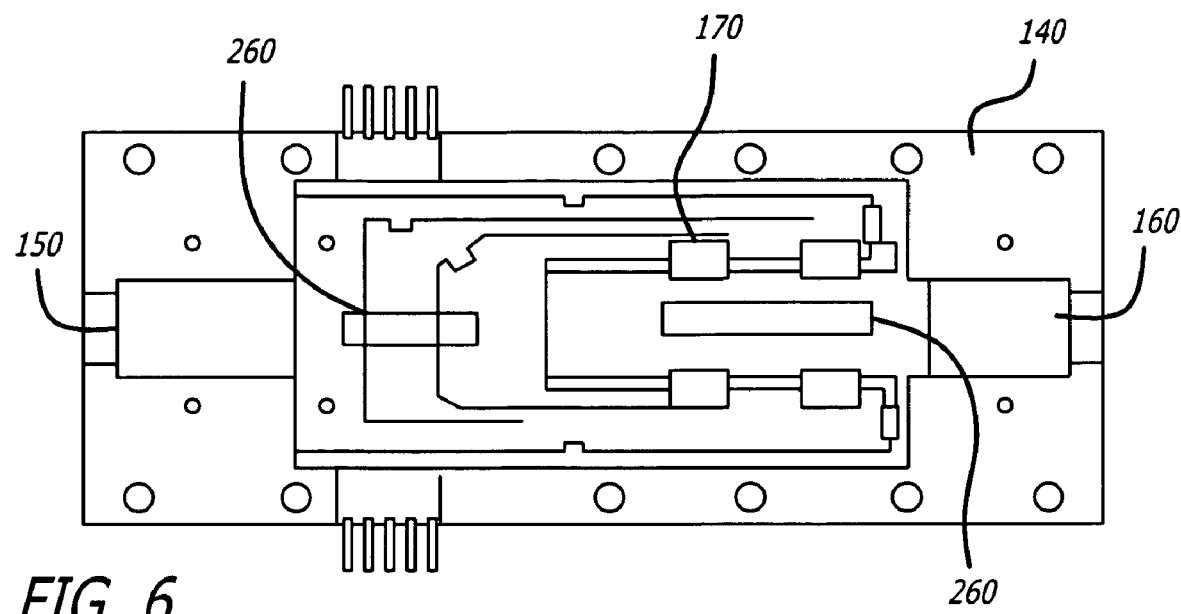
FIG. 6 is a side view of a slotline module according to another embodiment of the present invention.
Figure 7:
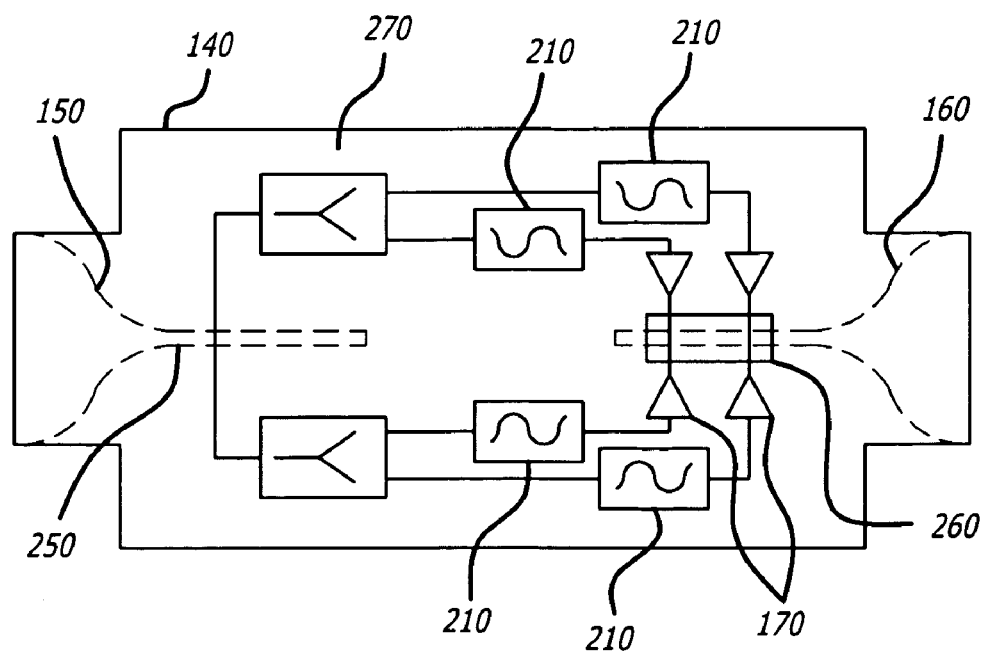
FIG. 7 is a circuit diagram showing circuit elements and a microstrip transitions according to one embodiment of the present invention.

Another technique for performing the present invention involves varying the number of circuit elements on a slotline module 140. FIG. 6 and FIG. 7 are a close-up view and a circuit diagram, respectively, of a slotline module 140 illustrating different embodiments in which the number of circuit elements comprising the circuit element portion 170 on a slotline module 140 is increased. Input slotline antennas 140 and output slotline antennas 150 are connected to circuit portions 170 on the slotline modules 140 by microstrip-to-slotline transitions 240. These slotline-to-microstrip transitions 240 may include different configurations as shown in FIG. 6 and FIG. 7. For example, a slotline-to-microstrip transition 240 may be a slotline-to-2 way microstrip transition 250, or a slotline-to-4-way microstrip transition 260. It is to be understood that the present invention contemplates that slotline-to-microstrip transitions 240 can be implemented in any number of ways to increase performance in a power combining array 100.

The present invention generally contemplates a slotline-to-microstrip transition 240 that transforms energy in a slotline mode to a two-way microstrip mode. In the embodiments of FIG. 6 and 7, the present invention employs a more sophisticated slotline-to-4-way-microstrip transition 260. Impedance matching structures may also be incorporated into these slotline-to-microstrip transitions 240. In this embodiment, the number of circuit elements that can couple from or to a slotline module 140 is doubled to allow the circuit elements to be physically arranged such that their outputs are very close to the slotline-to-microstrip transition 240, minimizing output losses and maximizing power combining efficiency. A delay equalization section 210 may also be used with this embodiment to further increase performance in the power combining array.

The embodiment of FIG. 7, as described above, shows the output of a slotline module 140 with a slotline-to 4-way microstrip transition 260. In this embodiment, the input uses a slotline-to 2-way microstrip transition 250 and at least one two-way microstrip power divider 270. Microstrip power dividers 270 are commonly used devices in the field of power combining arrays 100. In addition, certain microstrip power dividers 270, such as a Wilkinson power divider, isolate two divided ports from each other. Therefore, in this embodiment, the individual circuit elements on the slotline modules 140 are isolated from each other by the two-way microstrip power dividers 270. The entire spatially combined array 100 is therefore less susceptible to crosstalk between the circuit elements and thus is more stable, and less sensitive to variations or failures in the individual circuit elements. A delay equalization section 210 may also be implemented to further increase the performance of the power combining array 100. Also, as before, this embodiment may be generalized to incorporate slotline-to N-way microstrip transitions 240.

In this embodiment, at least one of the input slotline antennas 150 and output slotline antennas 160 includes an associated slotline-to-microstrip transition 240 having a slotline transmission line on one face of a dielectric layer upon which the slotline antenna is disposed. Also included may be a conducting strip oriented substantially perpendicular to the slotline antenna on an opposite face of the dielectric layer. The conducting strip forms two or more pair of differentially driven microstrip lines coupling the slotline antenna to an associated circuit element 170. The two or more pair of differentially driven microstrip lines may be separated by a distance along the slotline module 140 substantially equal to an integral number of quarter-wavelengths at the operating frequency. Additionally, the two or more differentially driven microstrip lines may separate a signal applied to the waveguide enclosure 110 through at least two sets of components in the circuit element 170 of a slotline module 140. The power divider 270 connects the slotline-to-microstrip transition to a component of a circuit element 170 and is configured to isolate components in the circuit element 170.

It is further understood that the embodiments illustrated in FIG. 6 and FIG. 7 and described in the preceding paragraphs may be applied to spatial power combiner arrays 100 using a coaxial architecture to increase the number of circuit elements coupled to or from a single slotline module 140. Additionally, any number of different circuit elements and different slotline-to-N-way microstrip transitions 240 may be combined to achieve the desired result in the present invention. Therefore, the present invention is not limited to circuit configurations shown in the accompanying drawings, and one of skill in the art will recognize the different slotline modules 140 in the waveguide enclosure 110 may have different circuit configurations designed to achieve increased performance in the power combining array 100.

Yet another technique for performing the present invention involves varying properties of circuit elements in the circuit element portion 170 for a slotline module 140. In this technique, properties of the circuit elements, such as the power-handling capacity, are varied to substantially match the signal amplitude. In one embodiment, a bias of an amplifier is varied in a circuit element portion 170 of at least one slotline module 140 to increase performance in the power combining array 100. It is understood that any property of a circuit element on any number of slotline modules 140 may be employed, which when varied substantially matches element characteristics to the signal amplitude contour. Additionally, any combination of varied circuit elements on any number of slotline modules 140 are contemplated by the present invention. As with other techniques and embodiments discussed herein, a delay equalization section 210 may be employed to further increase performance in the power combining array 100.

It is to be understood that other embodiments may be utilized and structural and functional changes may be made without departing from the scope of the present invention. The foregoing descriptions of embodiments of the invention have been presented for the purposes of illustration and description. It is not intended to be exhaustive or to limit the invention to the precise forms disclosed. Accordingly, many modifications and variations are possible in light of the above teachings. For example, varying any combination of characteristics of circuit elements and slotline antennas may produce acceptable performance increases in a power combining array 100. Additionally, varying an amount of space between each slotline module may also increase performance in a power combining array 100. Also, the embodiments of the present invention may be utilized to substantially equalize signal amplitude as a means of increasing performance in a power combining array. It is therefore intended that the scope of the invention be limited not by this detailed description.

The invention claimed is:

1. A power combiner apparatus, comprising:
a waveguide enclosure defined on an input side by an input waveguide section supporting an input field, and on an output side by an output waveguide section supporting an output field; and
an array of slotline modules disposed within the waveguide enclosure between the input waveguide section and the output waveguide section along an H-direction defined as a direction perpendicular to both a direction of propagation and a direction of an electric field in a fundamental mode supported by the waveguide enclosure, each of the slotline modules in the array of slotline modules including a circuit element having an input portion and an output portion, an input slotline antenna disposed between the input waveguide section and the input portion of the circuit element, and an output slotline antenna disposed between the output waveguide section and the output portion of the circuit element;
wherein different slotline modules within the array of slotline modules are configured to have varying characteristics according to a position in the H-direction of each slotline module in the array of slotline modules within the waveguide enclosure to cause a signal amplitude balance among the slotline modules to substantially follow a specified amplitude contour.

2. The power combiner apparatus of claim 1, wherein a longitudinal position along the direction of propagation of at least one of the input slotline antenna and the output slotline antenna in each of the slotline modules is varied according to each of the slotline modules' position along the H-direction within the waveguide enclosure.

3. The power combiner apparatus of claim 2, wherein the longitudinal position of the input slotline antenna is farther from the input waveguide section and the longitudinal position of the output slotline antenna is farther from the output waveguide section for each of the slotline modules near a center of the waveguide enclosure along the H-direction.

4. The power combiner apparatus of claim 2, wherein the longitudinal position of the input slotline antenna is closer to the input waveguide section and the longitudinal position of the output slotline antenna is closer to the output waveguide section for each slotline module near an edge of the waveguide enclosure.

5. The power combiner apparatus of claim 2, wherein the circuit element in at least one of the slotline modules includes a delay equalization section controlling signal delay from the input field to the output field through the at least one slotline module and configured to substantially equalize the signal delay from the input field to the output field through the array of slotline modules.

6. The power combiner apparatus of claim 5, wherein the delay equalization section includes a phase delay equalization network.

7. The power combiner apparatus of claim 5, wherein the delay equalization section includes a time delay equalization network.

8. The power combiner apparatus of claim 1, wherein a shape of at least one of the input slotline antenna and the output slotline antenna in each of the slotline modules is varied according to each of the slotline modules' position along the H-direction within the waveguide enclosure.

9. The power combiner apparatus of claim 8, wherein the circuit element in at least one of the slotline modules includes a delay equalization section controlling signal delay from the input field to the output field through the at least one of the slotline modules and configured to substantially equalize the signal delay from the input field to the output field through the array of slotline modules.

10. The power combiner apparatus of claim 9, wherein the delay equalization section includes a phase delay equalization network.

11. The power combiner apparatus of claim 9, wherein the delay equalization section includes a time delay equalization network.

12. The power combining apparatus of claim 1, wherein at least one of the input slotline antennas and output slotline antennas includes an associated slotline-to-microstrip transition having a slotline transmission line on a face of a dielectric layer upon which the at least one of the input slotline antennas and output slotline antennas is disposed, and having a conducting strip oriented substantially perpendicular to the at least one of the input slotline antennas and output slotline antennas on an opposite face of the dielectric layer, the conducting strip forming a pair of differentially driven microstrip lines coupling the at least one of the input slotline antennas and output slotline antennas to the circuit element associated with each of the slotline modules.

13. The power combiner apparatus of claim 12, wherein the conducting strip is joined to the pair of differentially driven pair of microstrip lines by at least one impedance transforming section.

14. The power combiner apparatus of claim 12 wherein the circuit element in at least one of the slotline modules includes a delay equalization section controlling signal delay from the input field to the output field through the at least one of the slotline modules and configured to substantially equalize the signal delay from the input field to the output field through the array of slotline modules.

15. The power combiner apparatus of claim 14, wherein the delay equalization section includes a phase delay equalization network.

16. The power combiner apparatus of claim 14, wherein the delay equalization section includes a time delay equalization network.

17. The power combiner apparatus of claim 1, wherein at least one of the input slotline antennas and output slotline antennas includes an associated slotline-to-microstrip transition having a slotline transmission line on a face of a dielectric layer upon which the at least one of the input slotline antennas and output slotline antennas is disposed, and having a conducting strip oriented substantially perpendicular to the at least one of the input slotline antennas and output slotline antennas on an opposite face of the dielectric layer, the conducting strip forming a pair of differentially driven microstrip lines coupling the slotline antenna to the circuit element associated with each of the slotline modules, and wherein a uniformity of signal amplitudes among the slotline modules is increased by varying a thickness of the dielectric layer upon which each input slotline antenna and output slotline antenna is formed according to the slotline module's position along the H-direction within the waveguide enclosure.

18. The power combiner apparatus of claim 17, wherein the circuit element in at least one of the slotline modules includes a delay equalization section controlling signal delay from the input field to the output field through the at least one of the slotline modules and configured to substantially equalize the signal delay from the input field to the output field through the array of slotline modules.

19. The power combiner apparatus of claim 18, wherein the delay equalization section includes a phase delay equalization network.

20. The power combiner apparatus of claim 18, wherein the delay equalization section includes a time delay equalization network.

21. The power combiner apparatus of claim 1, wherein at least one of the input slotline antennas and output slotline antennas includes an associated slotline-to-microstrip transition having a slotline transmission line on a face of a dielectric layer upon which the at least one of the input slotline antennas and output slotline antennas is disposed, and having a conducting strip oriented substantially perpendicular to the at least one of the input slotline antennas and output slotline antennas on an opposite face of the dielectric layer, the conducting strip forming a pair of differentially driven microstrip lines coupling the at least one of the input slotline antennas and output slotline antennas to the circuit element associated with each of the slotline modules, and wherein a uniformity of signal amplitudes among the slotline modules is increased by varying a permittivity of the dielectric layer upon which each input slotline antenna and output slotline antenna is formed according to the slotline module's position along the H-direction within the waveguide enclosure.

22. The power combiner apparatus of claim 21, wherein the circuit element in at least one of the slotline modules includes a delay equalization section controlling signal delay from the input field to the output field through the at least one of the slotline modules and configured to substantially equalize the signal delay from the input field to the output field through the array of slotline modules.

23. The power combiner apparatus of claim 22, wherein the delay equalization section includes a phase delay equalization network.

24. The power combiner apparatus of claim 22, wherein the delay equalization section includes a time delay equalization network.

25. The power combiner apparatus of claim 1, wherein at least one of the input slotline antennas and output slotline antennas includes an associated slotline-to-microstrip transition having a slotline transmission line on a face of a dielectric layer upon which the at least one of the input slotline antennas and output slotline antennas is disposed, and having a conducting strip oriented substantially perpendicular to the at least one of the input slotline antennas and output slotline antennas on an opposite face of the dielectric layer, the conducting strip forming two or more pair of differentially driven microstrip lines coupling the at least one of the input slotline antennas and output slotline antennas to the circuit element associated with each of the slotline modules.

26. The power combiner apparatus of claim 25, wherein the two or more pair of differentially driven microstrip lines are separated by a distance along the slotline module substantially equal to an integral number of quarter-wavelengths at the operating frequency.

27. The power combiner apparatus of claim 25, wherein the two or more differentially driven microstrip lines separate a signal applied to the waveguide enclosure through at least two sets of components in the circuit element of at least one of the slotline modules.

28. The power combiner apparatus of claim 27, further comprising a power divider connecting a slotline-to-microstrip transition to a component of the circuit element.

29. The power combining apparatus of claim 28, wherein the power divider configured to isolate components in the circuit element.

30. A power combining array comprising:
   a waveguide enclosure having a first end coupled to a waveguide input and second end coupled to a waveguide output;
   a plurality of slotline modules positioned within the waveguide enclosure, each of the slotline modules comprising at least one pair of slotline antennas, the at least one pair of slotline antennas including a first slotline antenna near a first end of each of the slotline modules, and a second slotline antenna near a second end of each of the slotline modules; and
   a circuit element portion, the circuit element portion coupled to each of the first and second slotline antennas in the pair of slotline antennas, wherein the first and second slotline antennas are positioned relative to the first and second ends of the waveguide enclosure to cause an amplitude balance among the slotline modules to substantially match a specified amplitude contour.

31. The power combiner apparatus of claim 30, wherein the circuit element portion in at least one of the slotline modules includes a delay equalization section controlling signal delay from the input field to the output field through the at least one of the slotline modules and configured to substantially equalize the signal delay from the waveguide input to the waveguide output through the plurality of slotline modules.

32. The power combining array of claim 31, wherein the delay equalization section includes a time delay equalization network.

33. The power combining array of claim 31, wherein the delay equalization section includes a phase delay equalization network.

34. The power combining array of claim 30, wherein characteristics of the first and second slotline antennas of different ones of the slotline modules are varied, such that a slotline antenna configuration of one of the slotline modules is different than that of another one of the slotline modules within the waveguide enclosure.

35. A power combining array comprising:
a waveguide enclosure having a first end coupled to a waveguide input and second end coupled to a waveguide output;
a plurality of slotline modules positioned within the waveguide enclosure, each printed on dielectric substrates and comprising at least one pair of slotline antennas, a first slotline antenna in the pair slotline antennas near a first end of each of the slotline modules, and a second slotline antenna in the pair of slotline antennas near a second end of each of the slotline modules; and
a circuit element portion, the circuit element portion coupled to each of the slotline antennas in the pair of slotline antennas, wherein a dielectric thickness of each slotline antenna is varied to cause an amplitude balance among the slotline modules to substantially match a specified amplitude contour across the plurality of slotline modules.

36. The power combining array of claim 35, wherein the dielectric thickness is varied so that the dielectric substrate for the slotline modules positioned near the center of the waveguide enclosure is thinner than the dielectric substrate for the slotline modules positioned near edges of the waveguide enclosure.

37. The power combining array of claim 36, wherein a dielectric constant of a material from which selected ones of the slotline modules are constructed is varied to further cause the amplitude balance among the slotline modules to substantially match the specified amplitude contour across the plurality of slotline modules.

38. The power combiner apparatus of claim 35, wherein the circuit element portion in at least one of the slotline modules includes a delay equalization section controlling signal delay from the input field to the output field through the at least one of the slotline modules and configured to substantially equalize the signal delay from the waveguide input to the waveguide output through the plurality of slotline modules.

39. The power combining array of claim 38, wherein the delay equalization section includes a time delay equalization network.

40. The power combining array of claim 38, wherein the delay equalization section includes a phase delay equalization network.

41. A power combining array comprising:
a waveguide enclosure having a first end coupled to a waveguide input and second end coupled to a waveguide output;
a plurality of slotline modules positioned within the waveguide enclosure, each printed on dielectric substrates and comprising at least one pair of slotline antennas, a first slotline antenna in the pair slotline antennas near a first end of each of the slotline modules, and a second slotline antenna in the pair of slotline antennas near a second end of each of the slotline modules; and
a circuit element portion, the circuit element portion coupled to each of the slotline antennas in the pair of slotline antennas, wherein a dielectric constant of a material from which selected ones of the slotline modules are constructed is varied to cause an amplitude balance among the slotline modules to substantially match a specified amplitude contour.

42. The power combining array of claim 41, wherein a thickness of the dielectric substrate is varied to further cause the amplitude balance among the slotline modules to substantially match the specified amplitude contour across the plurality of slotline modules, so that the dielectric substrate for the slotline modules positioned near the center of the waveguide enclosure is thinner than the dielectric substrate for the slotline modules positioned near edges of the waveguide enclosure.

43. The power combiner apparatus of claim 42, wherein the circuit element portion in at least one of the slotline modules includes a delay equalization section controlling signal delay from the input field to the output field through the at least one of the slotline modules and configured to substantially equalize the signal delay from the waveguide input to the waveguide output through the plurality of slotline modules.

44. The power combining array of claim 43, wherein the delay equalization section includes a time delay equalization network.

45. The power combining array of claim 43, wherein the delay equalization section includes a phase delay equalization network.

46. A method of increasing performance in a power combining array, comprising:
applying a microwave signal to a waveguide enclosure having a plurality of slotline modules positioned therein, each of the slotline modules having at least one pair of slotline antennas, wherein a field intensity of the microwave signal applied to the waveguide enclosure is stronger at a center of the waveguide enclosure and weaker at edges of the waveguide enclosure; and
varying characteristics of the slotline modules to cause an amplitude balance among the slotline modules to substantially match a specified amplitude contour through each of the slotline modules.

47. The method of claim 46, wherein the varying characteristics of the slotline modules further comprises varying a longitudinal position of the at least one pair of slotline antennas in the plurality of slotline modules.

48. The method of claim 46, further comprising implementing a delay equalization section in a circuit element portion of at least one of the slotline modules in the plurality of slotline modules, the delay equalization section configured to substantially equalize a signal delay through each of the slotline modules in the plurality of slotline modules.

49. The method of claim 48, wherein the delay equalization section includes a time delay equalization network.

50. The method of claim 48, wherein the delay equalization section includes a phase delay equalization network.

51. The method of claim 46, wherein the varying characteristics of the slotline modules further comprises varying a thickness of a dielectric substrate upon which the at least one pair of slotline antennas in the plurality of slotline modules are disposed.

52. The method of claim 51, further comprising implementing a delay equalization section in a circuit element portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

53. The method of claim 52, wherein the delay equalization section includes a time delay equalization network.

54. The method of claim 52, wherein the delay equalization section includes a phase delay equalization network.

55. The method of claim 46, wherein the varying characteristics of the slotline modules further comprises varying a dielectric constant of a material on which the at least one pair of slotline antennas are constructed.

56. The method of claim 55, further comprising implementing a delay equalization section in a circuit element portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

57. The method of claim 56, wherein the delay equalization section includes a time delay equalization network.

58. The method of claim 56, wherein the delay equalization section includes a phase delay equalization network.

59. The method of claim 46, wherein the varying characteristics of the slotline modules further comprises varying a thickness of a dielectric substrate upon which the at least one pair of slotline antennas in the plurality of slotline modules are disposed and varying a dielectric constant of a material on which the at least one pair of slotline antennas are constructed.

60. The method of claim 59, further comprising implementing a delay equalization section in a circuit element portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

61. The method of claim 60, wherein the delay equalization section includes a time delay equalization network.

62. The method of claim 60, wherein the delay equalization section includes a phase delay equalization network.

63. A method of increasing performance in a power combining array, comprising:
applying a microwave signal to a waveguide enclosure having a plurality of slotline modules positioned therein, each of the slotline modules having at least one pair of slotline antennas, wherein a field intensity of the microwave signal applied to the waveguide enclosure is stronger at a center of the waveguide enclosure and weaker at edges of the waveguide enclosure; and
varying a longitudinal position of the at least one pair of slotline antennas in the plurality of slotline modules to cause an amplitude balance among the slotline modules to substantially match a specified amplitude contour through each of the slotline modules.

64. The method of claim 63, wherein the varying a longitudinal position of the at least one pair of slotline antennas further comprises varying characteristics of the at least one pair of slotline antennas, so that at least one pair of slotline antennas' configuration of one of the slotline modules is different than that of another one of the slotline modules within the waveguide enclosure.

65. The method of claim 63, further comprising implementing a delay equalization section in a circuit portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

66. The method of claim 65, wherein the delay equalization section includes a time delay equalization network.

67. The method of claim 65, wherein the delay equalization section includes a phase delay equalization network.

68. A method of increasing performance in a power combining array, comprising:
applying a microwave signal to a waveguide enclosure having a plurality of slotline modules positioned therein, each of the slotline modules having at least one pair of slotline antennas, wherein a field intensity of the microwave signal applied to the waveguide enclosure is stronger at a center of the waveguide enclosure and weaker at edges of the waveguide enclosure; and
varying characteristics of the at least one pair of slotline antennas, so that a slotline antenna configuration of one of the slotline modules is different than that of another one of the slotline modules within the waveguide enclosure to cause an amplitude balance among the slotline modules to substantially match a specified amplitude contour through each of the slotline modules.

69. The method of claim 68, further comprising implementing a delay equalization section in a circuit element portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

70. The method of claim 69, wherein the delay equalization section includes a time delay equalization network.

71. The method of claim 69, wherein the delay equalization section includes a phase delay equalization network.

72. A method of increasing performance in a power combining array, comprising:
applying a microwave signal to a waveguide enclosure having a plurality of slotline modules positioned therein, each of the slotline modules having at least one pair of slotline antennas, wherein a field intensity of the microwave signal applied to the waveguide enclosure is stronger at a center of the waveguide enclosure and weaker at edges of the waveguide enclosure; and
varying a thickness of a dielectric substrate upon which the at least one pair slotline antennas are disposed to cause an amplitude balance among the slotline modules to substantially match a specified amplitude contour through each of the slotline modules.

73. The method of claim 72, further comprising varying a dielectric constant of a material from which at least one of the slotline modules in the plurality of slotline modules is constructed.

74. The method of claim 72, further comprising implementing a delay equalization section in a circuit element portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

75. The method of claim 74, wherein the delay equalization section includes a time delay equalization network.

76. The method of claim 74, wherein the delay equalization section includes a phase delay equalization network.

77. A method of increasing performance in a power combining array, comprising:

applying a microwave signal to a waveguide enclosure having a plurality of slotline modules positioned therein, each of the slotline modules having at least one pair of slotline antennas, wherein a field intensity of the microwave signal applied to the waveguide enclosure is stronger at a center of the waveguide enclosure and weaker at edges of the waveguide enclosure; and varying a thickness of a dielectric substrate upon which the at least one pair of slotline antennas are disposed to cause an amplitude balance among the slotline modules to substantially match a specified amplitude contour through each of the slotline modules; and varying a dielectric constant of a material from which the at least one pair of slotline antennas are constructed.

78. The method of claim 77, further comprising implementing a delay equalization section in a circuit element portion of at least one of the slotline modules in the plurality of slotline modules, the delay equalization section controlling signal delay from the input field to the output field through the at least one of the slotline modules and configured to substantially equalize the signal delay through each of the slotline modules in the plurality of slotline modules.

79. The method of claim 78, wherein the delay equalization section includes a time delay equalization network.

80. The method of claim 78, wherein the delay equalization section includes a phase delay equalization network.

81. A power combiner apparatus, comprising:
a waveguide enclosure defined on an input side by an input waveguide section supporting an input field, and on an output side by an output waveguide section supporting an output field; and
an array of slotline modules disposed within the waveguide enclosure between the input waveguide section and the output waveguide section along an H-direction defined as a direction perpendicular to both a direction of propagation and a direction of an electric field in a fundamental mode supported by the waveguide enclosure, each of the slotline modules in the array of slotline modules including a circuit element having an input portion and an output portion, and a pair of slotline antennas including an input slotline antenna disposed between the input waveguide section and the input portion of the circuit element, and an output slotline antenna disposed between the output waveguide section and the output portion of the circuit element;
wherein at least one of the input slotline antennas and output slotline antennas includes an associated slotline-to-microstrip transition having a slotline transmission line on one face of a dielectric layer upon which the at least one of the input slotline antennas and output slotline antennas is disposed, and having a conducting strip oriented substantially perpendicular to the at least one of the input slotline antennas and output slotline antennas on an opposite face of the dielectric layer, the conducting strip forming a pair of differentially driven microstrip lines coupling the at least one of the input slotline antennas and output slotline antennas to the circuit element associated with each of the slotline modules.

82. The power combining array of claim 81, further comprising a delay equalization section in a circuit element of at least one of the slotline modules in the array of slotline modules, the delay equalization section controlling signal delay from the input field to the output field through the at least one of the slotline modules and configured to substantially equalize the signal delay from the input field to the output field through the array of slotline modules.

83. The power combining array of claim 82, wherein the delay equalization section includes a time delay equalization network.

84. The power combining array of claim 82, wherein the delay equalization section includes a phase delay equalization network.

85. A power combiner apparatus, comprising:
a waveguide enclosure defined on an input side by an input waveguide section supporting an input field, and on an output side by an output waveguide section supporting an output field; and
an array of slotline modules disposed within the waveguide enclosure between the input waveguide section and the output waveguide section along an H-direction defined as a direction perpendicular to both a direction of propagation and a direction of an electric field in a fundamental mode supported by the waveguide enclosure, each of the slotline modules in the array of slotline modules including a circuit element having an input portion and an output portion, and a pair of slotline antennas including an input slotline antenna disposed between the input waveguide section and the input portion of the circuit element, and an output slotline antenna disposed between the output waveguide section and the output portion of the circuit element;
wherein at least one of the input slotline antennas and output slotline antennas includes an associated slotline-to-microstrip transition having a slotline transmission line on one face of a dielectric layer upon which the at least one of the input slotline antennas and output slotline antennas is disposed, and having a conducting strip oriented substantially perpendicular to the at least one of the input slotline antennas and output slotline antennas on an opposite face of the dielectric layer, the conducting strip forming two or more pair of differentially driven microstrip lines coupling the at least one of the input slotline antennas and output slotline antennas to the circuit element associated with each of the slotline modules.

86. The power combiner apparatus of claim 85, wherein the two or more differentially driven microstrip lines are separated by a distance along the slotline module substantially equal to an integral number of quarter-wavelengths at the operating frequency.

87. The power combiner apparatus of claim 85, wherein the two or more differentially driven microstrip lines separate a signal applied to the waveguide enclosure through at least two sets of components in the circuit element of each of the slotline modules.

88. The power combiner apparatus of claim 87, further comprising a power divider connecting a slotline-to-microstrip transition to a component of the circuit element.

89. The power combining apparatus of claim 88, wherein the power divider is configured to isolate components in the circuit element.

* * * * *